(12) United States Patent
Ren et al.

(10) Patent No.: US 10,770,344 B2
(45) Date of Patent: Sep. 8, 2020

(54) CHAMFERLESS INTERCONNECT VIAS OF SEMICONDUCTOR DEVICES

(71) Applicant: GLOBALFOUNDRIES INC., Grand Cayman (KY)

(72) Inventors: Yuping Ren, Clifton Park, NY (US); Haigou Huang, Rexford, NY (US); Ravi Prakash Srivastava, Clifton Park, NY (US); Zhiguo Sun, Halfmoon, NY (US); Qiang Fang, Ballston Lake, NY (US); Cheng Xu, Dresden (DE); Guoxiang Ning, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/244,071

(22) Filed: Jan. 9, 2019

(65) Prior Publication Data
US 2020/0219763 A1 Jul. 9, 2020

(51) Int. Cl.
*H01L 21/768* (2006.01)
*H01L 23/522* (2006.01)
*H01L 21/311* (2006.01)
*H01L 21/02* (2006.01)

(52) U.S. Cl.
CPC .. *H01L 21/76813* (2013.01); *H01L 21/31122* (2013.01); *H01L 21/7681* (2013.01); *H01L 21/76832* (2013.01); *H01L 21/76834* (2013.01); *H01L 23/5226* (2013.01); *H01L 21/0228* (2013.01); *H01L 21/02178* (2013.01); *H01L 21/02266* (2013.01)

(58) Field of Classification Search
CPC ... H01L 21/02; H01L 21/021; H01L 21/0217; H01L 21/02178; H01L 21/022; H01L 21/0226; H01L 21/02266; H01L 21/0228; H01L 21/31; H01L 21/311; H01L 21/3112; H01L 21/31122; H01L 21/76; H01L 21/768; H01L 21/7681; H01L 21/76813; H01L 21/7683; H01L 21/76832; H01L 21/76834
USPC ......................................................... 257/774
See application file for complete search history.

(56) References Cited

U.S. PATENT DOCUMENTS

| | | | |
|---|---|---|---|
| 5,476,817 A * | 12/1995 | Numata | H01L 21/02126 257/E21.273 |
| 6,603,167 B2 * | 8/2003 | Hsue | H01L 28/55 257/301 |
| 6,696,222 B2 | 2/2004 | Hsue et al. | |
| 9,406,512 B2 | 8/2016 | Bristol et al. | |
| 10,304,729 B2 * | 5/2019 | Tsai | H01L 21/76804 |
| 2003/0008490 A1 | 1/2003 | Xing et al. | |
| 2014/0024220 A1 | 1/2014 | Chang et al. | |

\* cited by examiner

*Primary Examiner* — Monica D Harrison
(74) *Attorney, Agent, or Firm* — David Cain (57) ABSTRACT

A method of fabricating interconnects in a semiconductor device is provided, which includes forming an interconnect layer having a conductive line and depositing a first aluminum-containing layer over the interconnect layer. A dielectric layer is deposited over the first aluminum-containing layer, followed by a second aluminum-containing layer deposited over the dielectric layer. A via opening is formed in the second aluminum-containing layer through to the conductive line, wherein the via opening has chamferless sidewalls.

20 Claims, 7 Drawing Sheets

CHAMFERLESS INTERCONNECT VIAS OF SEMICONDUCTOR DEVICES

FIELD OF THE INVENTION

The disclosed subject matter relates generally to a method of fabricating semiconductor devices, and more particularly to a method of fabricating chamferless interconnect vias of semiconductor devices and the resulting device.

BACKGROUND

One of the long-standing objectives in the advancement of semiconductor technology is scaling. Technology scaling results in higher integration of semiconductor components, such as transistors, interconnections, etc. However, technology scaling poses several challenges, such as requiring stricter design rules along with smaller process margins to overcome greater process variation, tool development, etc.

Fabrication of interconnect structures by dual damascene integration scheme has been widely adopted for advanced technology nodes. The dual damascene integration scheme involves forming conductive lines and its underlying interconnect vias in a same deposition step. For such interconnect via fabrication, conventional fabrication processes are often inadequate to produce smaller geometries with the required structural integrity. Undesirable tapered profiles can form at the top and/or sidewalls of the interconnect vias and may cause unwanted deviation from electrical design specifications, thereby compromising the quality and reliability of the semiconductor device. The conventional approach to reducing the dimensions of IC devices is to rely on improvements to the photolithographic process, however, such improvements can be time consuming and costly.

For the reasons described above, there is a strong need for chamferless interconnect via fabrication methods that can provide interconnect vias with improved structural integrality and reliability.

SUMMARY

To achieve the foregoing and other aspects of the disclosure, a method of fabricating chamferless interconnect vias of semiconductor devices and the resulting device are presented.

According to an aspect of the disclosure, a method of fabricating interconnects in a semiconductor device is provided, including forming an interconnect layer having a conductive line and depositing a first aluminum-containing layer over the interconnect layer. A dielectric layer is deposited over the first aluminum-containing layer, followed by a second aluminum-containing layer deposited over the dielectric layer. A via opening is formed in the second aluminum-containing layer through to the conductive line, wherein the resulting via opening has chamferless sidewalls.

According to another aspect of the disclosure, a method of fabricating interconnects in a semiconductor device is provided, including forming an interconnect layer having a conductive line and depositing a first aluminum-containing layer over the interconnect layer. A first dielectric layer is deposited over the interconnect layer. A second aluminum-containing layer is deposited over the first dielectric layer, followed by a second dielectric layer deposited over the second aluminum-containing layer. A via opening having an upper portion is formed in the second dielectric layer, exposing the second aluminum-containing layer. A first extension of the upper portion of the via opening is performed through the exposed second aluminum-containing layer to expose the first dielectric layer. A second extension of the upper portion of the via opening is performed to form a lower portion of the via opening, wherein a trench opening is formed in the second dielectric layer concurrently.

According to yet another aspect of the disclosure, an interconnect structure in a semiconductor device is presented, included a first conductive line, a first aluminum-containing layer, a first dielectric layer, a second aluminum-containing layer, a second conductive line and an interconnect via. The first aluminum-containing layer is deposited over the first conductive line and the first dielectric layer is deposited over the first aluminum-containing layer. The second aluminum-containing layer is deposited over the first dielectric layer. The interconnect via is connecting the first conductive line and the second conductive line, wherein the interconnect via has chamferless sidewalls.

BRIEF DESCRIPTION OF THE DRAWINGS

The embodiments of the present disclosure will be better understood from a reading of the following detailed description, taken in conjunction with the accompanying drawings:

FIGS. 2A-7B are cross-sectional views (taken along lines A-A' and B-B' as indicated in FIG. 1) depicting a method of fabricating interconnect structures, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. In the present disclosure, the semiconductor device has structures beneath the conductive layer that are not shown.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the present disclosure.

The disclosure relates to a method of fabricating chamferless interconnect vias of semiconductor devices by interposing an aluminum-containing layer in an interlayer dielectric (ILD) layer and the resulting device. Aspects of the disclosure are now described in detail with accompanying figures. It is noted that like and corresponding elements are referred to by the use of the same reference numerals.

Figure 1:
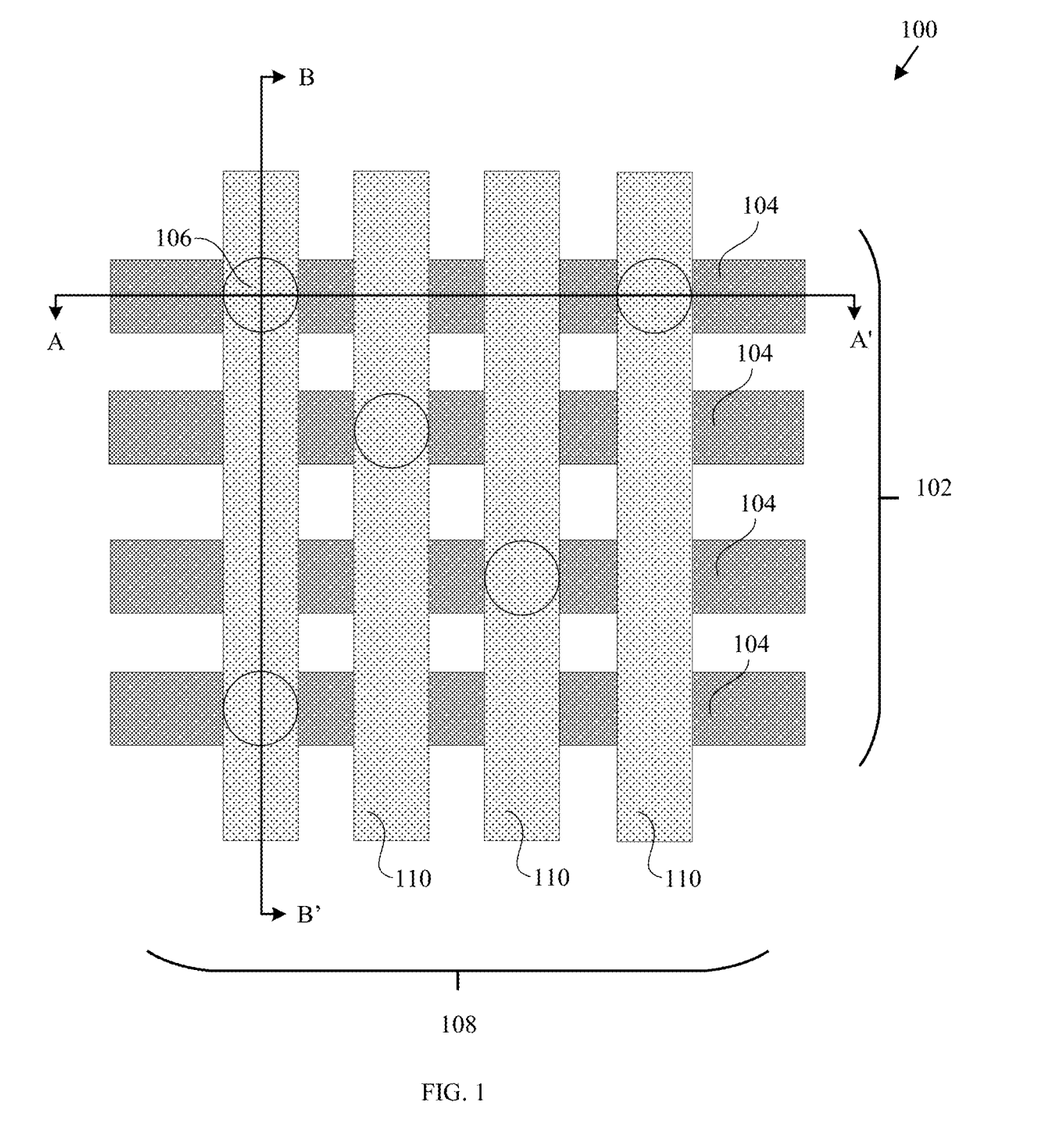
FIG. 1 is a top view of a semiconductor device, according to an embodiment of the disclosure.

FIG. 1 is a top view of a semiconductor device 100, according to an embodiment of the disclosure. The semiconductor device 100 includes an array of first conductive lines 104 interposed in a dielectric material forming a first interconnect layer 102, a plurality of interconnect vias 106 over the array of first conductive lines 104 and an array of second conductive lines 110 interposed over the plurality of interconnect vias 106. The array of second conductive lines 110 and the plurality of interconnect vias 106 are interposed in an interlayer dielectric (ILD) layer and form a second interconnect layer 108. It should be understood that the number and placements of the interconnect vias may vary according to the specific design of each semiconductor device. In this embodiment, the second conductive lines 110 formed are perpendicular to the first conductive lines 104.

FIGS. 2A-7B are cross-sectional views of a semiconductor device 200, taken along lines A-A' and B-B' as indicated in FIG. 1, illustrating a method of fabricating chamferless interconnect vias of semiconductor devices by interposing an aluminum-containing layer in an ILD layer, according to an embodiment of the disclosure. More specifically, the line A-A' is taken along a short axis of the second conductive line, and the line B-B' is taken along a long axis of the second conductive line, perpendicular to the line A-A'.

Figure 2A:
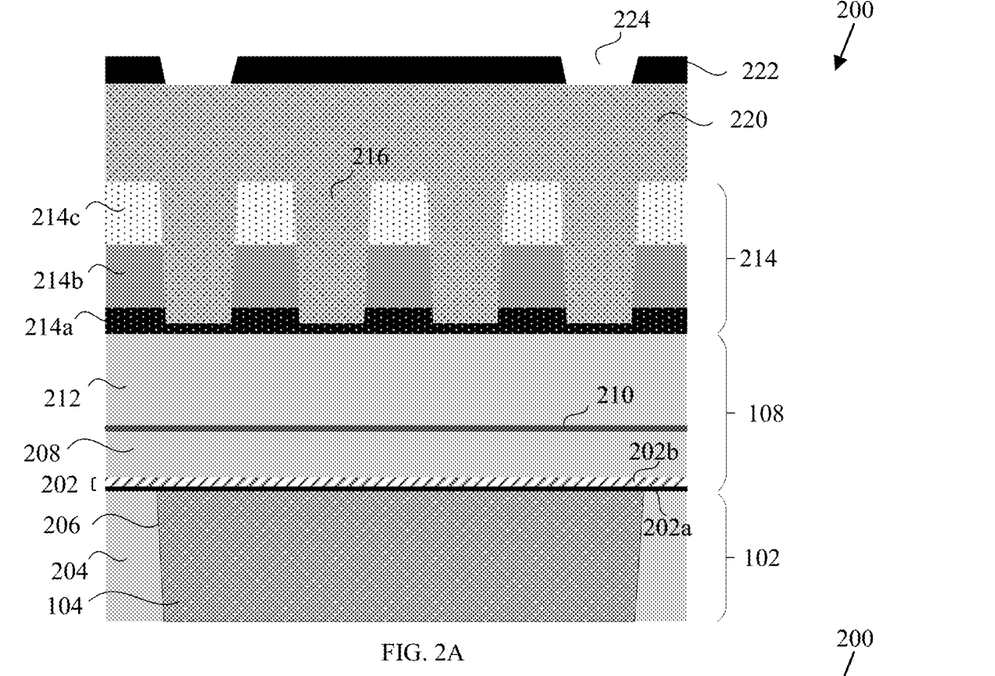
Figure 2B:
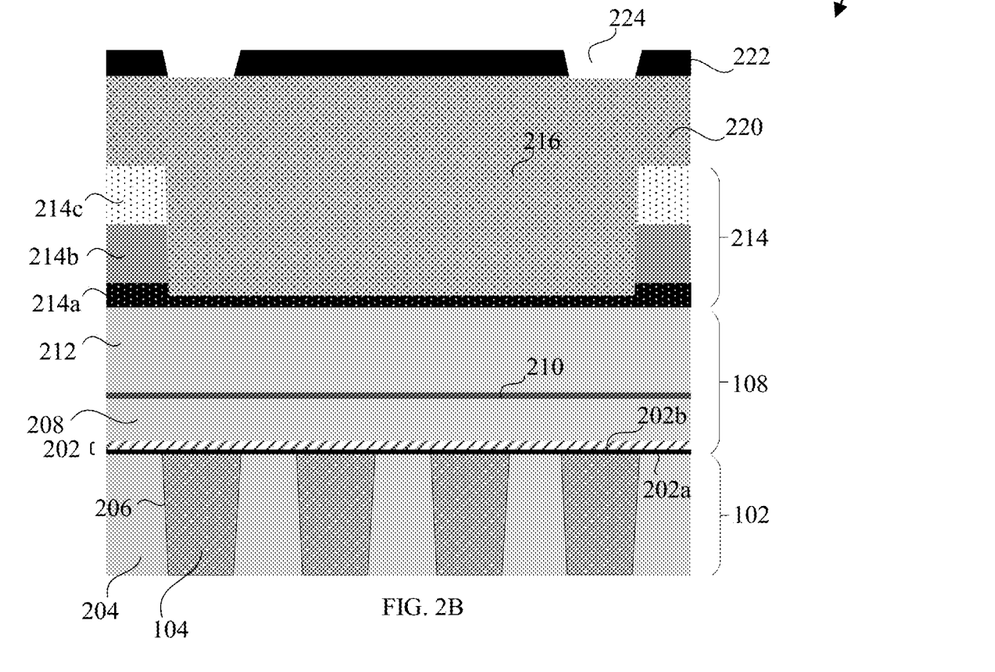

Referring to FIGS. 2A and 2B, the semiconductor device 200 includes the first interconnect layer 102 and an etch stop layer (ESL) 202. As illustrated by FIG. 2B, the first interconnect layer 102 includes an array of first conductive lines 104 interposed in a first dielectric layer 204. A first diffusion barrier liner 206 is deposited between the first dielectric layer 204 and the first conductive lines 104. The ESL 202 is deposited over the first interconnect layer 102. In one embodiment, the first conductive line 104 comprises Cu and the first dielectric layer 204 comprises an ultra-low k dielectric (ULK) material, i.e., a dielectric material having an ultra-low dielectric constant. The first dielectric layer 204 may also be formed of a dense ULK (DULK) or a low-k dielectric material. The first diffusion barrier liner 206 comprises tantalum (Ta), titanium (Ti), nitrides of these metals or a combination thereof (e.g., tantalum nitride/tantalum (TNT)).

In another embodiment of the disclosure, the first dielectric layer 204 may be formed of octamethylcyclotetrasiloxane (OMCT). In yet another embodiment, the ESL 202 is a bilayer stack including a first layer 202a and a second layer 202b over the first layer 202a. The first layer 202a is formed of aluminum nitride (AlN) having an approximate thickness of 1.2 nm and the second layer 202b is formed of oxygen-doped carbide (ODC) having an approximate thickness of 5 nm. Advantageously, the second layer 202b of the ESL 202 functions as a moisture barrier, preventing moisture penetration into the first layer 202a of the ESL and to the first conductive lines 104.

The semiconductor device 200 further includes a second dielectric layer 208, an aluminum-containing layer 210 and a third dielectric layer 212 sequentially deposited over the ESL layer 202. In one embodiment of the disclosure, the second dielectric layer 208 and the third dielectric layer 212 is an ULK dielectric material, and form the ILD layer of the semiconductor device 200. The ILD layer may also be formed of a DULK or a low-k dielectric material. The second dielectric layer 208 and the third dielectric layer 212 may or may not be formed of the same dielectric material as the first dielectric layer 204.

In the embodiments of the disclosure, the aluminum-containing layer 210 is an aluminum compound. In some embodiments, aluminum oxide ($Al_xO_y$, where x and y are in stoichiometric ratio) is preferred. A suitable deposition process may be used to deposit $Al_xO_y$, such as physical vapor deposition (PVD) process. Alternatively, AlN may also be used to form the aluminum-containing layer 210, and may be suitably deposited using atomic layer deposition (ALD). In another embodiment of the disclosure, the aluminum-containing layer 210 has a preferred thickness ranging from 1 to 2 nm. An objective of this disclosure is to keep the dielectric constant of the dielectric layers low, therefore it is desirable to deposit the aluminum-containing layer 210 as thinly as possible.

A patterning stack 214 having with trench patterns 216 is formed over the third dielectric layer 212 by a plurality of processes. A spin-on-hardmask layer (SOH) 220 is deposited over the trench patterns 216 and a layer of low temperature oxide (LTO) 222 having openings 224 is formed over the SOH 220. The layer of LTO 222 acts as a hard mask layer to transfer the openings 224 to the layers below the LTO layer 222. The openings 224 are aligned to the underlying trench patterns 216 and the underlying first conductive lines 104, as illustrated in FIG. 2A. In one embodiment of the disclosure, the patterning stack 214 includes a trilayer of silicon nitride (SiN) 214a, titanium nitride (TiN) 214b over the SiN 214a, and another layer of SiN 214c over the TiN 214b, as illustrated in FIGS. 2A and 2B.

In alternative embodiments of the disclosure, the patterning stack 214 includes a trilayer of silicon oxynitride (SiON), TiN over the SiON and another layer of SiON over the TiN. The openings 224 may also be formed from suitable patterning process, such as patterning a photoresist layer using photolithography, and transferring the openings 224 to underlying layer of backside antireflective coating (BARC) by a suitable material removing process. The openings 224 are then further transferred to a layer of SiON beneath the BARC to expose a portion of the SOH 220, similar to FIGS. 2A and 2B.

Figure 3A:
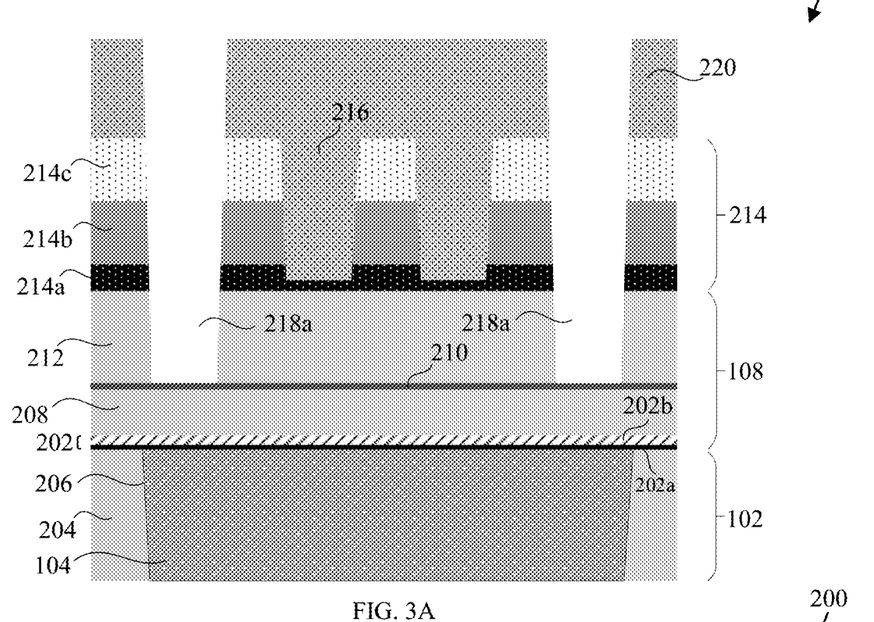
Figure 3B:
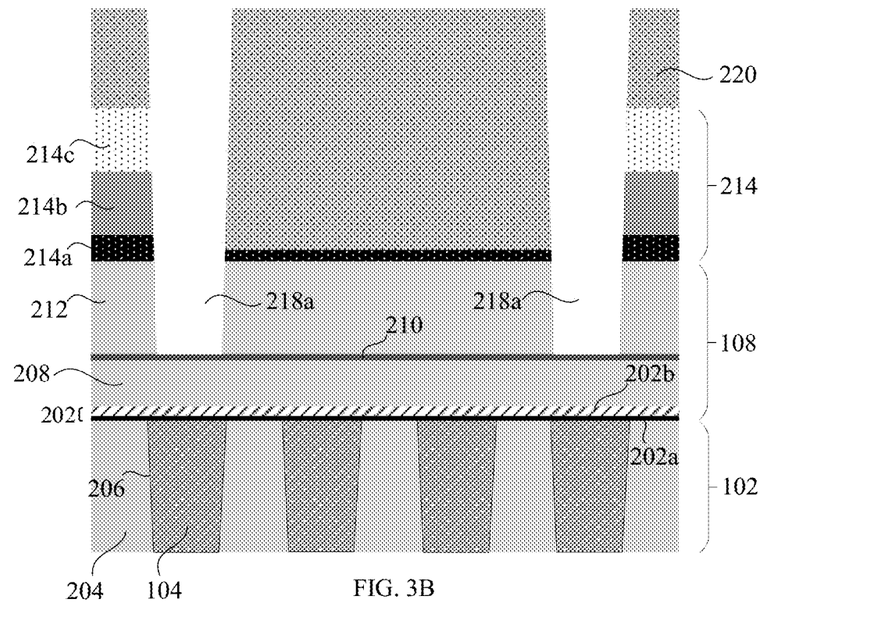

FIGS. 3A and 3B illustrate the semiconductor device 200 after forming upper portion of via openings 218a in the third dielectric layer 212. A suitable material removing process, such as anisotropic reactive ion etch (RIE), is employed to extend the openings 224 in the LTO 222 to the underlying SOH 220 to expose selected trench patterns 216 in the patterning stack 214. Another suitable material removing process further extends the openings 224 to the aluminum-containing layer 210, to form the upper portion of the via openings 218a. The suitable material removing process employed is preferably highly selective to the aluminum-containing layer 210. For purposes of this disclosure, a highly selective material removing process refers to a process having a relative removal rate in excess of 20:1 between the two materials of primary concern (i.e., the third dielectric layer 212 being removed and the aluminum-containing layer 210).

As the aluminum-containing layer 210 will remain predominantly intact during the material removing process, the material removing process may be time-controlled with a pre-determined removal rate of the third dielectric layer 212 to stop at the aluminum-containing layer 210. In one embodiment of the disclosure where the aluminum-containing layer 210 is $Al_xO_y$, the material removal selectivity may be as high as 50:1 between the third dielectric layer 212 and the aluminum-containing layer 210, i.e., for every 50 nm of material removed from the third dielectric layer 212, only 1 nm of material will be removed from the aluminum-containing layer 210. In another embodiment of the disclosure where the aluminum-containing layer 210 is AN, the material removal selectivity may be as high as 25:1 between the third dielectric layer 212 and the aluminum-containing layer 210.

Figure 4A:
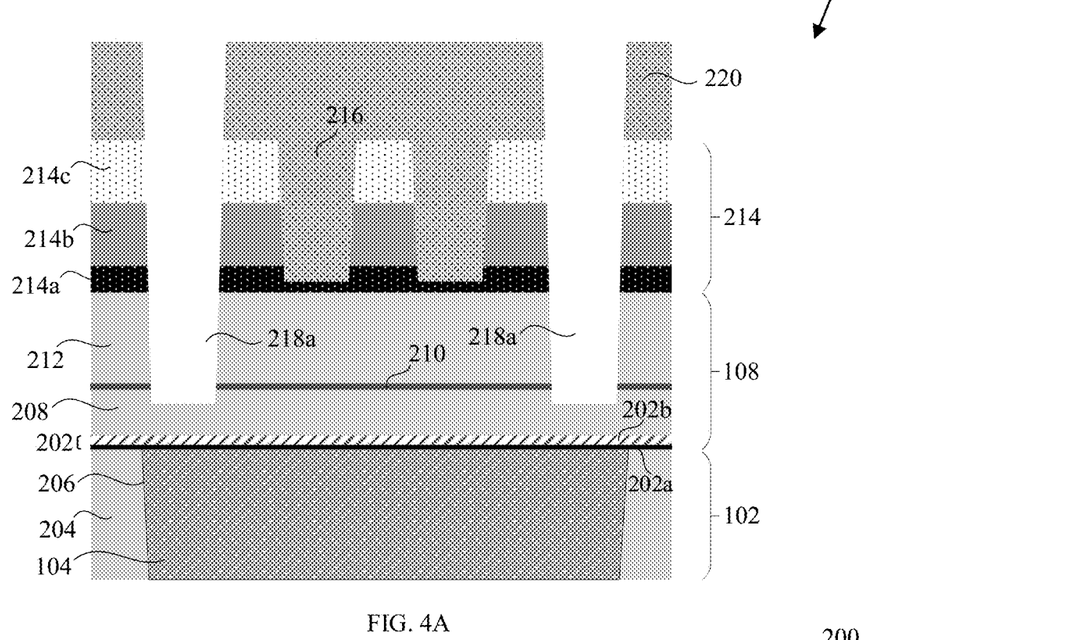
Figure 4B:
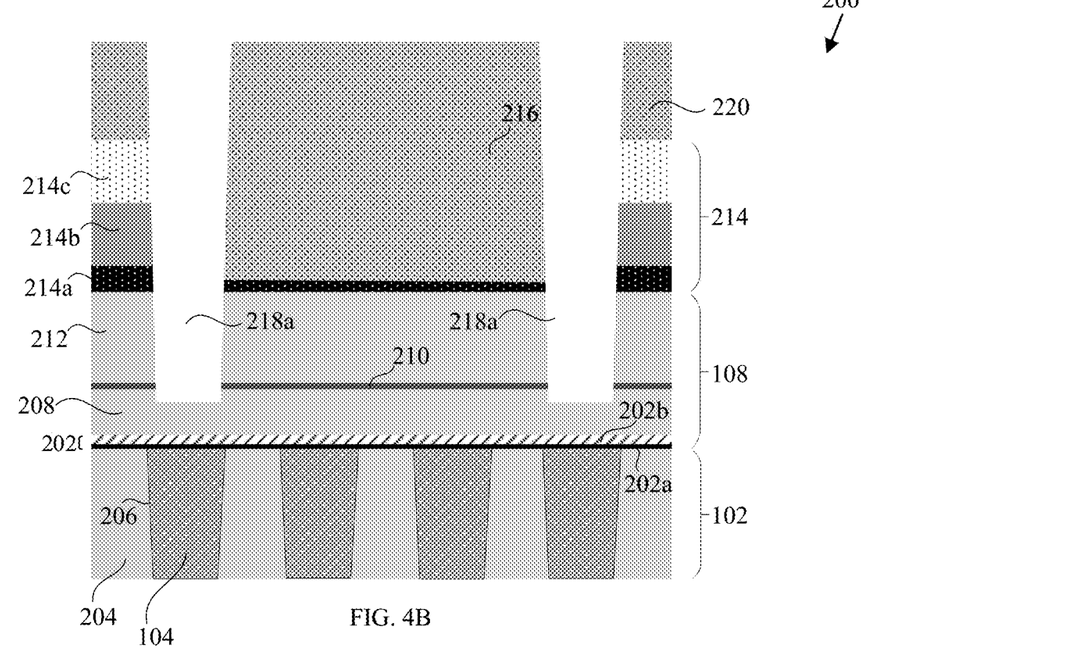

FIGS. 4A and 4B illustrate the semiconductor device 200 after removing the exposed aluminum-containing layer 210. A similar material removing process, such as the process used to form the upper portion of the via openings 218a, may be employed to punch through the aluminum-containing layer 210. The material removing process may require a higher radio frequency power to increase ion bombardment on the aluminum-containing layer 210 to facilitate its removal. Due to the material removing process being highly selective to the aluminum-containing layer 210, a portion of the second dielectric layer 208 may be expected to be removed during the process as shown in the drawings. The portion of the second dielectric layer 208 removed is greater than the portion of the aluminum-containing layer 210 removed.

Figure 5A:
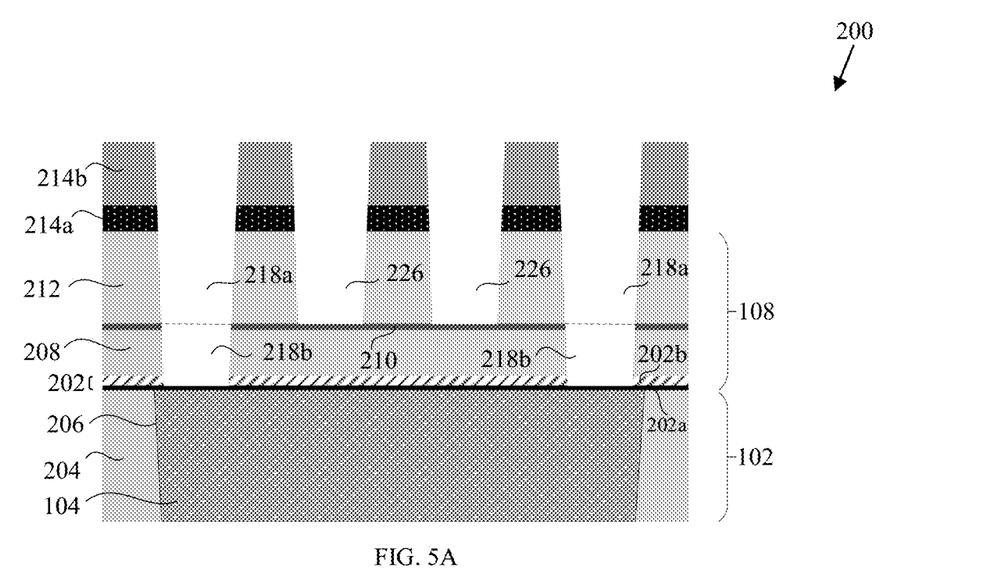
Figure 5B:
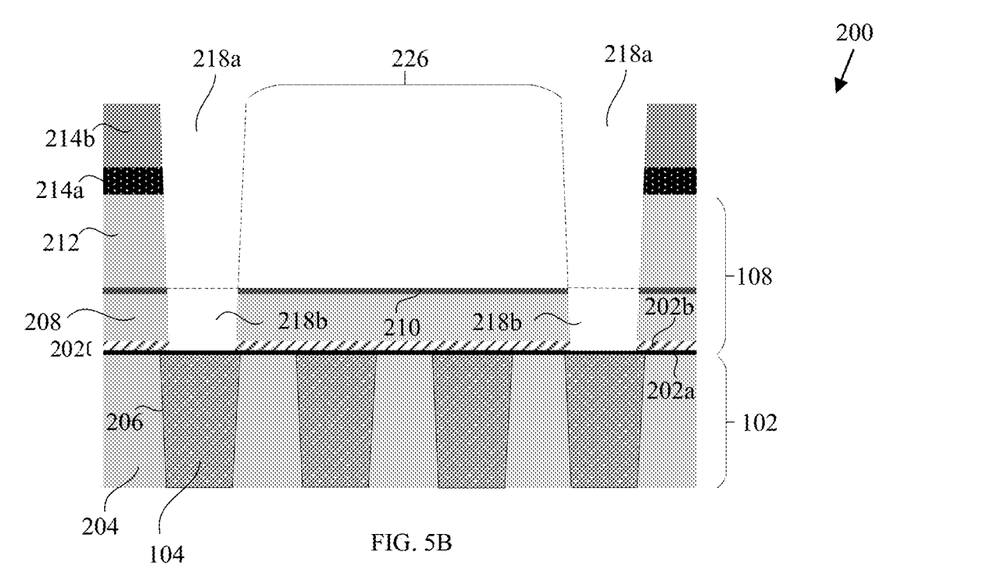

FIGS. 5A and 5B illustrate the semiconductor device 200 after forming lower portion of the via openings 218b in the second dielectric layer 208. Following the removal of the exposed aluminum-containing layer 210 and the SOH 220, a further suitable material removing process is employed, such as RIE process, to extend the upper portion of the via openings 218a through the second dielectric layer 208 and the second layer 202b of the ESL 202, forming the lower portion of the via openings 218b. The upper portion of the via openings 218a and the underlying lower portion of the via openings 218b are demarcated with dotted lines in FIGS. 5A and 5B. The aluminum-containing layer 210 acts like a hard mask layer at shoulder portions of the lower portion of the via openings 218b, limiting the amount of chamfering during extension of the upper portion of the via openings 218a into the second dielectric layer 208. The formed lower portion of the via openings 218b in the second dielectric layer 208 have substantially straight sidewalls, i.e., chamferless. Portions of the ESL 202 are exposed in the via openings (218a and 218b), more specifically, the first layer 202a of the ESL 202. The via openings (218a and 218b) are aligned over the first conductive lines 104 in the first interconnect layer 102.

Concurrently, trench openings 226, defined by the patterning stack 214, are formed in the third dielectric layer 212, above the aluminum-containing layer 210. The suitable material removing process employed is preferably highly selective to the aluminum-containing layer 210, similar to the process employed to form the upper portion of the via openings 218a. As such, the trench openings 226 formed is expected to "self-stop" on the aluminum-containing layer 210, without extending into the second dielectric layer 208.

As illustrated in FIG. 5B, the trench openings 226 will merge with the upper portion of the via openings 218a, as demarcated with dotted lines in FIG. 5B. The third layer 214c of the patterning stack 214 has been removed during the material removing process.

In practice, it would be appreciated by those skilled in the art that the sidewalls of the lower portion of the via openings 218b may have slightly rounded edges. Due to intrinsic higher material removal rate at sharp edges than at flat surfaces, the material removing process may render sharp edges less distinct. However, the slightly rounded edges at the lower portion of the via openings 218b are expected to be substantially confined as compared to conventionally fabricated via openings, due to the high material removing selectivity to the aluminum-containing layer 210.

Figure 6A:
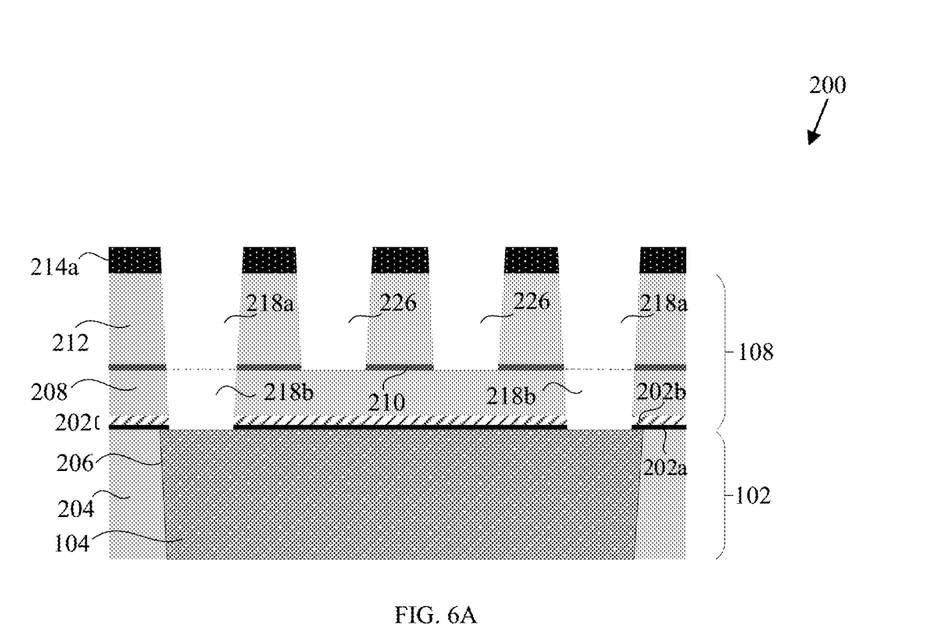
Figure 6B:
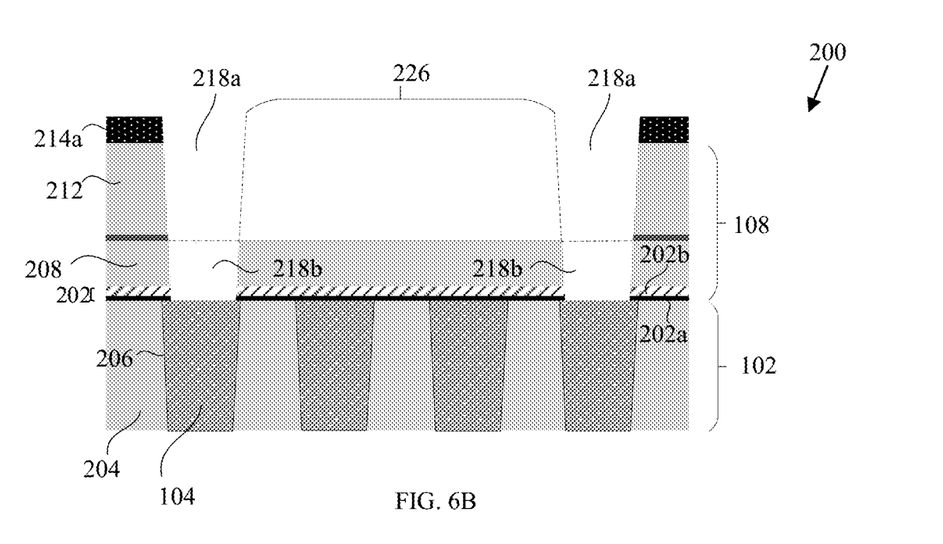

FIGS. 6A and 6B illustrate the semiconductor device 200 after removing the exposed portions of the aluminum-containing layer 210 in the trench openings 226 and the first layer 202a of the ESL 202 exposed in the lower portion of the via openings 218b. A suitable material removing process is employed, such as wet etch process. The wet etch process may include using any appropriate chemicals, such as a mixture of amine derivatives and heterocyclic compounds, etc. In one embodiment of the disclosure, the wet etch chemical is EKC580, a chemical developed and marketed by EKC Technology, INC. with a model number of EKC580. The wet etch process will selectively remove the exposed portions of the first layer 202a of the ESL 202 in the lower portion of the via openings 218b, the exposed portions of the aluminum-containing layer 210 in the trench openings 226, and the second layer 214b of the patterning stack 214.

Figure 7A:
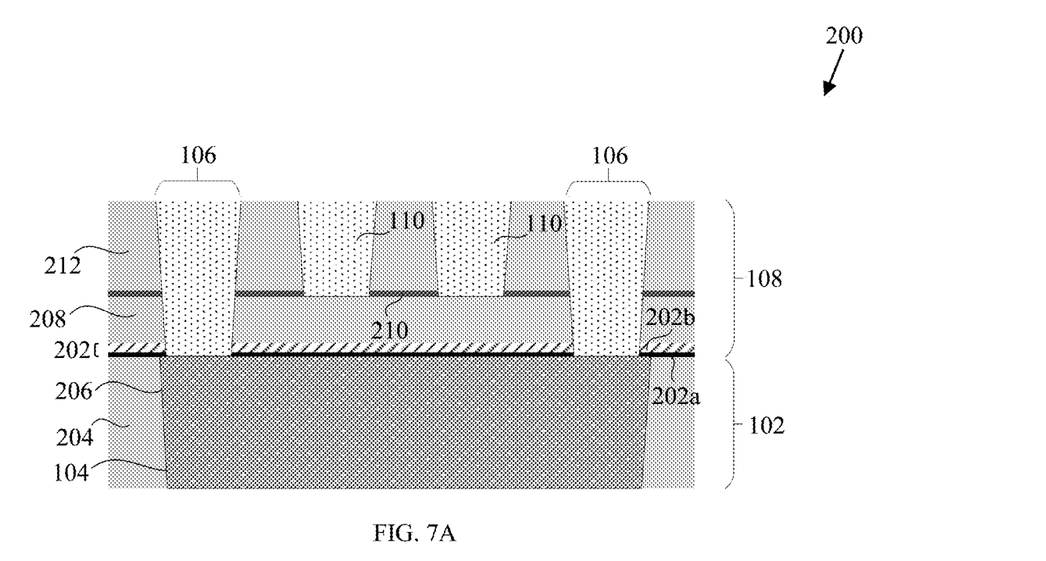
Figure 7B:
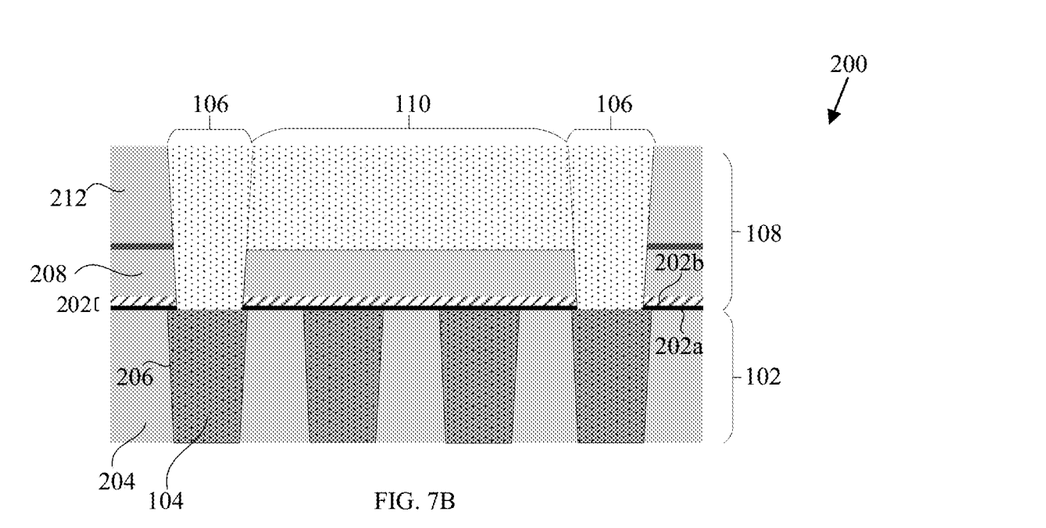

FIGS. 7A and 7B illustrate the semiconductor device 200 after a plurality of processes to form the interconnect vias 106 and the second conductive lines 110 adopting the dual damascene integration scheme. A second diffusion barrier liner 228 is deposited conformally in the via openings (218a and 218b) and the trench openings 226, and a conductive material is deposited to form the interconnect vias 106 and the second conductive lines 110. A chemical-mechanical planarization process performed to form a planar surface, removing the first layer 214a of the patterning stack 214 in the process. In one embodiment of the disclosure, the second diffusion barrier liner 228 may be formed of the same or a different material as the first diffusion barrier liner 206.

As presented in the above detailed description, a method of fabricating chamferless interconnect vias of semiconductor devices and the resulting device are presented. By using the disclosed method, the interconnect vias are formed having an aluminum-containing layer at shoulder portions of via openings. Advantageously, the aluminum-containing layer acts like a hard mask layer, limiting the amount of chamfering during the fabrication of the via openings, resulting in the fabrication of chamferless via openings. The aluminum-containing layer also acts like an etch stop layer, during trench opening fabrication, limiting extension of the trench openings to the underlying dielectric layer.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A method of fabricating interconnects in a semiconductor device comprising:
   forming an interconnect layer comprising a conductive line;
   depositing a first aluminum-containing layer over the interconnect layer;
   depositing a dielectric layer over the first aluminum-containing layer;
   depositing a second aluminum-containing layer over the dielectric layer; and
   forming a via opening in the second aluminum-containing layer through to the conductive line, wherein the via opening has chamferless sidewalls.

2. The method of claim 1, further comprises:
   the dielectric layer is a first dielectric layer and the via opening is a lower portion of a via opening;
   depositing a second dielectric layer over the second aluminum-containing layer; and
   selectively forming an upper portion of the via opening in the second dielectric layer, wherein the lower portion of the via opening is formed by extending the upper portion of the via opening below the second aluminum-containing layer.

3. The method of claim 2, wherein forming the lower portion of the via opening, further comprises:
   etching to extend the upper portion of the via opening to expose a portion of the first aluminum-containing layer in the lower portion of the via opening and concurrently etching to form a trench opening in the second dielectric layer, wherein the trench opening exposes a portion of the second aluminum-containing layer.

4. The method of claim 3, further comprises removing the exposed portion of the first aluminum-containing layer and the exposed portion of the second aluminum-containing layer using a wet etch process, wherein the trench opening is connected to the first dielectric layer and the lower portion of the via opening is connected to the conductive line in the interconnect layer.

5. The method of claim 2, wherein forming and extending the upper portion of the via opening, further comprises:
   removing a portion of the second dielectric layer using a first reactive ion etch process, exposing a portion of the second aluminum-containing layer in the upper portion of the via opening; and
   removing the exposed portion of the second aluminum-containing layer using a second reactive ion etch process to extend the upper portion of the via opening below the second aluminum-containing layer, wherein the second reactive ion etch process uses a higher radio frequency power than the first reactive ion etch process.

6. The method of claim 5, wherein the first reactive ion etch process has an etch selectivity greater than 20:1 between the deposited second dielectric layer and the second aluminum-containing layer.

7. The method of claim 1 wherein the deposited second aluminum-containing layer comprises aluminum oxide or aluminum nitride.

8. The method of claim 1, wherein the deposited second aluminum-containing layer is deposited using physical vapor deposition process or atomic layer deposition process.

9. The method of claim 1 wherein the deposited second aluminum-containing layer has a thickness ranging from 1 to 2 nm.

10. A method of fabricating interconnects in a semiconductor device comprising:
    forming an interconnect layer comprising a conductive line;
    depositing a first aluminum-containing layer over the interconnect layer;
    depositing a first dielectric layer over the first aluminum-containing layer;
    depositing a second aluminum-containing layer over the first dielectric layer;
    depositing a second dielectric layer over the second aluminum-containing layer;
    forming a via opening having an upper portion in the second dielectric layer, exposing the second aluminum-containing layer;
    performing a first extension of the upper portion of the via opening through the exposed second aluminum-containing layer to expose the first dielectric layer; and
    performing a second extension of the upper portion of the via opening in the first dielectric layer to form a lower portion of the via opening, wherein a trench opening is concurrently formed in the second dielectric layer.

11. The method of claim 10 wherein the upper portion of the via opening is formed using a reactive ion etch process with an etch selectivity greater than 20:1 between the second dielectric layer and the deposited second aluminum-containing layer.

12. The method of claim 10, wherein the first extension of the upper portion of the via opening is performed by a first reactive ion etch process and the second extension of the upper portion of the via opening is performed by a second reactive ion etch process, wherein the first reactive ion etch process uses a higher radio frequency power than the second reactive ion etch process.

13. The method of claim 10 wherein the deposited second aluminum-containing layer comprises aluminum oxide or aluminum nitride.

14. The method of claim 10, wherein the second aluminum-containing layer is deposited using physical vapor deposition process or atomic layer deposition process.

15. The method of claim 10 wherein the deposited second aluminum-containing layer has a thickness ranging from 1 to 2 nm.

16. An interconnect structure in a semiconductor device comprising:
    a first interconnect layer comprising a first conductive line;
    a first aluminum-containing layer over the first interconnect layer;
    a second interconnect layer over the first aluminum-containing layer, wherein the second interconnect layer comprises a second aluminum-containing layer interposed within an interlayer dielectric layer; and
    an interconnect via connected to the first conductive line, wherein the interconnect via has chamferless sidewalls that partially expose the second aluminum-containing layer.

17. The interconnect structure of claim 16, wherein the second aluminum-containing layer comprises aluminum oxide or aluminum nitride.

18. The interconnect structure of claim 16, wherein the second aluminum-containing layer has a thickness ranging from 1 to 2 nm.

19. The interconnect structure of claim 16, wherein the first aluminum-containing layer is a first layer of a bilayer stack.

20. The interconnect structure of 19, wherein the bilayer stack further comprises a second layer over the first layer, the second layer comprises an oxygen-doped carbide layer.

* * * * *